United States Patent [19]
Arnold
[11] 3,879,677
[45] Apr. 22, 1975

[54] TUNED OSCILLATOR CIRCUIT HAVING A TUNED FILTER OUTPUT

[75] Inventor: Charles A. Arnold, Palo Alto, Calif.

[73] Assignee: Varian Associates, Palo Alto, Calif.

[22] Filed: July 20, 1973

[21] Appl. No.: 381,128

[52] U.S. Cl. .................. 331/77; 331/94; 331/117 R; 333/73 R

[51] Int. Cl. .................. H03b 5/36

[58] Field of Search .......... 333/73 R, 73 C; 331/94, 331/107 G, 117, 77

[56] References Cited

UNITED STATES PATENTS

| | | | |
|---|---|---|---|
| 2,817,761 | 12/1957 | Hollmann | 331/117 D |
| 2,889,460 | 6/1959 | Ehret | 331/117 |
| 3,274,588 | 9/1966 | Brown | 331/117 |
| 3,290,625 | 12/1966 | Bartram et al. | 333/73 R |
| 3,435,385 | 3/1969 | Cohen | 333/73 |
| 3,544,918 | 12/1970 | Venator, Jr. | 331/107 G |

OTHER PUBLICATIONS

Proc IEEE, Yig-tuned, W. J. Dauksher et al. p. 1660, Oct. 1965.

European Microwave Conference of 1969, London, England (8-12 Sept. 1969) 464-F, X-band Electronic Spin Oscillator pp. 464-467.

*Primary Examiner*—John Kominski
*Attorney, Agent, or Firm*—Stanley Z. Cole; Paul Hentzel

[57] ABSTRACT

A transistor microwave oscillator circuit is provided with a YIG resonator device coupled to one of the transistor terminals. The YIG device resonates at a frequency established by a magnetic field applied thereacross and determines the oscillation frequency of the transistor circuit. Another YIG device is provided as a frequency responsive output transformer and functions as a high Q filter. This YIG transformer is positioned within the same applied magnetic field and has a resonant frequency identical to the YIG resonator. That is, the center frequency of the bandpass filter is the same as the oscillator frequency. As the applied magnetic field is varied, both the oscillation frequency of the transistor and the center frequency of the filter vary an identical amount. This frequency tracking insures that the oscillations are optimally passed by the filter, while off-frequencies are maximally attenuated. Further, the YIG transformer functions as an output impedance matching device. The YIG transformer is loop or coil-coupled to the transistor output terminal and loop-coupled to the load. These coupling coils may easily be modified as to number of turns and proximity to the YIG spheres to effect an optimal impedance match in a manner similar to conventional transformer coupling.

10 Claims, 9 Drawing Figures

TUNED OSCILLATOR CIRCUIT HAVING A TUNED FILTER OUTPUT

FIELD OF THE INVENTION

This invention relates to YIG tuned oscillator circuits and more particularly to such circuits employing YIG tuned output filters.

DESCRIPTION OF THE PRIOR ART

Heretofore, YIG resonators placed in a transistor emitter circuit have been used to control the oscillation frequency by varying magnetic field applied across the YIG device. The energy required to sustain oscillation was established by base-to-emitter feedback to the YIG resonator. The transistor output generally contained a coventional fixed frequency filter circuit which established the desired bandwidth for a single oscillation frequency or, at most, a narrow band of oscillation frequencies.

These fixed frequency filters are unable to accommodate tunable YIG resonators. Wide bandpass filters provide some matching, but unfortunately also pass off-frequency transistor noise. Further, when the oscillator is operating at the low end of the fixed wide bandpass, undesirable second harmonics of this oscillation may pass through the filter near the upper end of the bandpass. Narrowing the bandpass of the conventional filter minimizes noise and eliminates second harmonics but also limits the utility of the oscillator circuit.

Further, the input impedances of microwave loads are substantially higher than transistor output impedances. Thus prior art oscillator circuits require an additional circuit for impedance matching to maximize energy transfer. Impedance matching using fixed components is difficult and marginally effective in variable frequency applications.

SUMMARY OF THE PRESENT INVENTION

It is therefore an object of this invention to provide an oscillator circuit having a YIG resonator and an output YIG device which cooperate to effect improved operation.

It is another object of this invention to provide a YIG tuned oscillator having a YIG tuned high Q bandpass filter in the output circuit to minimize second harmonics and off-frequency noise.

It is an additional object of this invention to provide a YIG tuned oscillator having an impedance matching YIG output transformer.

Briefly, the present invention accomplishes these and other objects and advantages by providing a ferrimagnetic resonator coupled to an amplifier. The resonator is mounted within a magnetic field which determines its resonant frequency. Positive feedback between the resonator and the amplifier establish oscillation at the resonant frequency. The amplifier output is coupled to a bandpass filter having a second ferrimagnetic device mounted in the same magnetic field as the resonator, or another magnetic field of equal strength. Thus, the two ferrimagnetic devices have the same gyromagnetic resonance frequency — the center frequency of the filter is the same as the resonant frequency of the oscillator. As the magnetic field is adjusted in strength, the oscillation and center frequencies change by the same amount. The bandpass filter remains tuned to the oscillation frequency and rejects the off-frequencies and noise as the oscillator is swept through its operable spectrum. The filter may be coil-coupled to the amplifier and to the load, thus permitting coupling adjustment for matching impedances.

BRIEF DESCRIPTION OF THE DRAWINGS

Further objects and advantages of the present invention and the operation thereof will become apparent from the following detailed descriptions taken in conjunction with the drawings in which:

FIG. 1 shows a YIG-tuned oscillator circuit 10 formed by a transistor 12 having a base terminal 14, an emitter terminal 16, and a collector terminal 18. A YIG resonator 20 is connected to the transistor emitter terminal 16 for establishing the operating frequency of oscillator 10. YIG resonator 20 resonates at a frequency determined by a magnetic field 24 applied across YIG 20. YIG 20 is mounted in gap 26 of core 27 between pole pieces 28 and 29. The output stage of oscillator 10 is a YIG transformer device 30 connected to transistor 12 through primary loop 32 and connected to a load 34 through a secondary loop 36.

Figure 1:
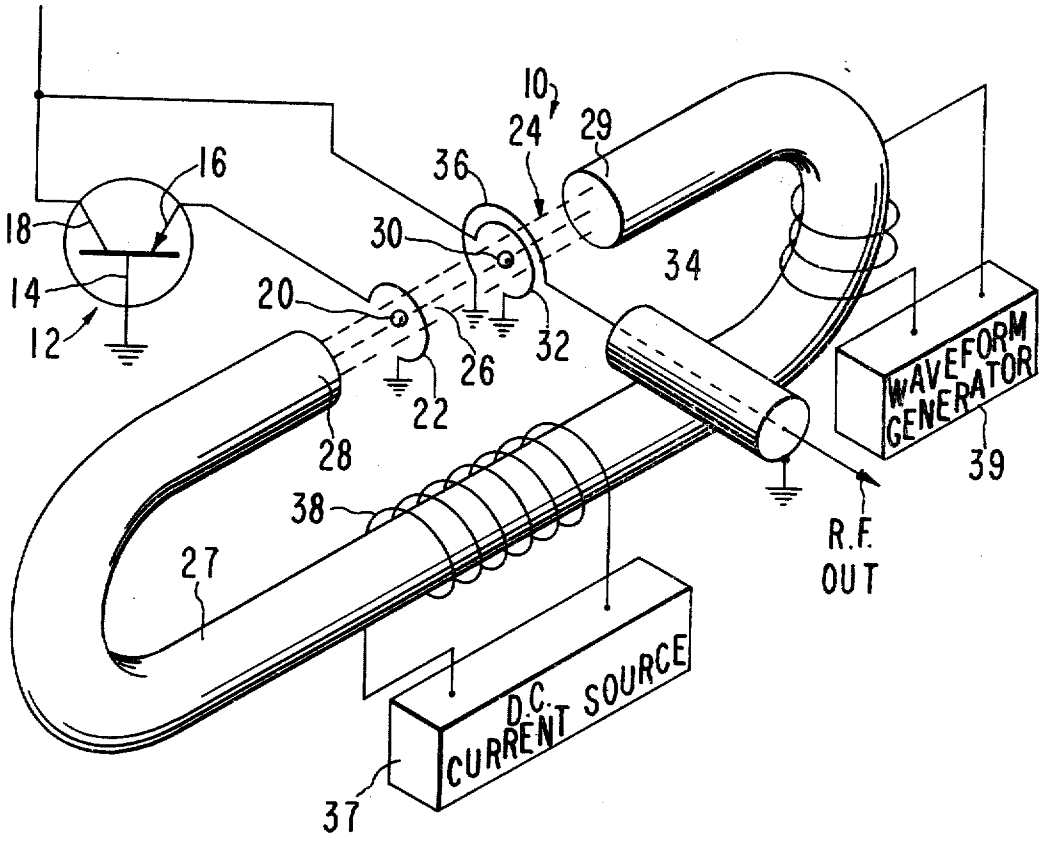
FIG. 1 is a schematic drawing of a YIG-tuned oscillator having a single YIG stage output.
Figure 2:
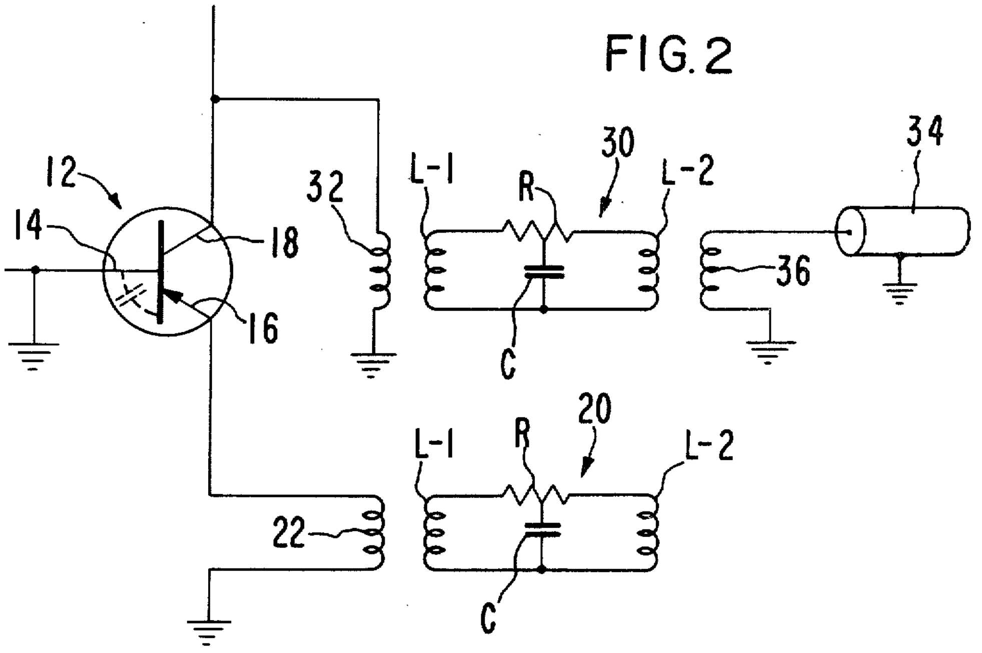
FIG. 2 is the circuit of FIG. 1 showing the equivalent circuits of the YIG devices.

The operation of the YIG tuned oscillator circuit 10 of FIG. 1 will become more apparent from studying the equivalent circuit thereof shown in FIG. 2. The equivalent circuit of YIG resonator 20 and YIG transformer 30 is an L-C tank circuit having input inductor L-1 and output inductor L-2, and a shunt capacitance C. This L-C effect is common to all ferrimagnetic materials and is due to the alignment of the atomic diopole elements with the applied magnetic field. The electron spin causes certain electron orbits to precess in response to the field and return 90° later in a gyroscopic manner. The rate of recession and return establishes the gyromagnetic resonance frequency of the material (the resonant frequency of the equivalent L-C tank).

YIG device 20 is coupled to transistor 12 through L-1 and emitter coil 22. In the initial preoscillating state, random noise signals from transistor 12 are coupled into the YIG 20 L-C tank and cause the tank to resonate at its gyromagnetic resonance frequency as determined by applied magnetic field 24. The resonance signal is fed back to transistor base 14 through the interelectrode base to collector capitance 42, shown in FIG. 2 as dotted lines. The resonant signal is amplified by transistor 12 and coupled once again to the L-C tank circuit which reinforces the tank resonance. The build-up continues, and circuit 10 subsequently oscillates at the resonant frequency of the tank circuit. The output of transistor 12 is coupled to the input inductance L-1 of YIG 30 which functions as a YIG filter.

YIG filter 30 has a YIG sphere placed in the center of two coupling loops 32 and 36 whose axes are perpendicular to each other and to the direction of the applied magnetic field. When no external field is applied, there is little input-to-output coupling through the unmagnetized YIG sphere, since coupling loops 32 and 36 are at right angles to each other. However, in the presence of a d-c magnetic field (Hd), the YIG material's magnetic properties change and coupling from the input to the output can occur even though the coupling loops are at right angles. The amount of coupling depends on the r-f signal frequency and the magnetic-field strength. R-f energy at the gyromagnetic resonance frequency $f_o$=2.8$H_d$, will be coupled with little attenuation, but at other frequencies the attentuation becomes quite high.

Both resonator YIG 20 and transformer YIG 30 exhibit high Q resonance at identical gyromagnetic resonance frequencies because they are both in the same magnetic field 24. As magnetic field 24 is increased, the oscillation frequency increases and the bandpass center frequency increases by an identical amount. The operating frequency of circuit 10 is always centered at the midband of tunable YIG filter 30. Because of this frequency tracking feature, YIG filter 30 may have a very high Q (typically from 1000 to 3000). The upper limit on Q is determined by surface defects and internal atomic losses represented by R in the FIG. 2 equivalent circuit. The resulting narrow bandpass minimizes off-frequency noise and eliminates second harmonics from the oscillator output. These unwanted signals are shunted to ground through each YIG device 20 and 30. The YIG tank circuits have a high shunt impedance only at the gyromagnetic resonance frequency determined by magnetic field 24.

YIG tuned resonators and bandpass filters offer a special advantage over the corresponding conventional circuits. In conventional circuits, the Q is generally a constant and the bandpass on each side of the center frequency is a fixed percentage of the center frequency. At high center frequencies the bandpass spreads and passes more frequencies, causing the sensitivity to deteriorate. In a tuned YIG circuit, the unloaded Q is directly proportional to the magnetic field, as is the gyromagnetic resonant frequency. Both increase as the field increases, resulting in constant bandpass independent of frequency.

Magnetic field 24 is established in core 27 and across gap 26 by a permanent magnet or by an adjustable current source 37 with magnetizing coils 38 or by a combination of both. The precise magnetic field required depends on the gyromagnetic resonance frequency desired, and the current required to supply that field varies as a function of the permeability of core 27, the number of turns in coil 38, and the length of gap 26. In tuned YIG applications, gaps vary from about 0.040 inch to about 0.100 inch and the permeabilities are on the order of 60,000. The resonant frequency to magnetizing current relationship is generally about 5–25 megahertz per milliampere. Periodic variations in the current produce corresponding variations in magnetic field 24 and causes modulation of the resonance frequency. For example, a ramp current waveform will produce a periodic linear frequency sweep of, for example, 2–4 gigahertz, which is suitable for use in spectrum analysers, local oscillators, and microwave sweepers. Preferably, the base frequency is established by a tightly coupled direct or ramp current source 37 and fast sweep or modulation is established by loosely coupled waveform generator 39 which provides the required current. A sinewave output of generator 39 produces a frequency modulated envelope on the oscillator's output frequency. If a constant resonance frequency is desired, a direct current magnetizing source must be employed to produce a constant strength magnetic field 24. It is preferred that both YIGS 20 and 30 be positioned in the same gap and the same magnetic field. This insures that the YIGS are exposed to identical field strengths and have identical gyromagnetic resonance frequencies.

Any ferrimagnetic material having a sufficiently low magnetization saturation such as lithium ferrite or yttrium iron garnet, may be employed in spheres 20 and 30. However, a gallium-doped yttrium iron garnet (YIG) single crystal sphere is preferred because of its lower saturation magnetization and resonance stabilization properties. Saturation magnetization is a condition which must exist in the sphere before gyromagnetic resonance may occur. The gallium dopant lowers the saturation point and resonance frequency of pure YIG material which in undoped form has a lower limit on gyromagnetic frequency of about 3.5 gigahertz. Other dopants such as Aluminum may be employed. Further, the amplification element of circuit 10 need not be a transistor. Any amplification means with sufficient positive feedback to oscillate may be employed.

Transformer YIG device 30 can be easily modified to impedance match the 5–10 ohms at the output of transistor 12 to the desired load, which is typically a 50 ohm coaxial cable. The YIG input loop 32 and output loop 36 can be modified in length and proximity to the YIG sphere to easily alter the YIG device input impedance and the YIG device output impedance.

Figure 3:
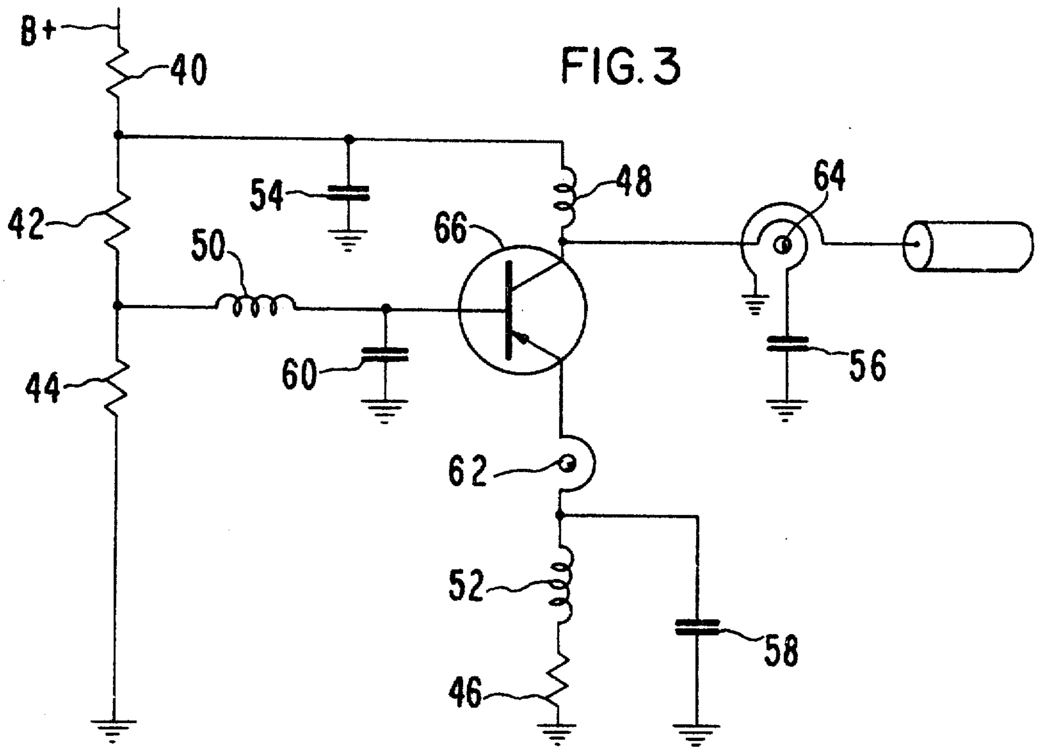
FIG. 3 is a schematic drawing of a specific example of a dual YIG-tuned oscillator.

FIG. 3 shows a specific example of dual YIG tuned circuit 10 of FIG. 1. The following list describes the d-c supply voltage requirements, the circuit components, and the output specifications for the circuit:

- B+ is 15 volts dc
- Resistor 40 is 200 ohms
- Resistor 42 is 1.5K ohms
- Resistor 44 is 510 ohms
- Emitter Resistor 46 is 50 ohms
- Collector Isolating Inductance 48 is 7 turns of 5 mil wire about an air core 30 mils in diameter
- Base Isolating Inductance 50 is distributive
- Emitter Isolating Inductance 52 is distributive
- Bypass Capacitors 54, 56, and 58 are 500 picofarads
- Base Bypass Capacitance 60 is 200 picofarads
- Spheres 62 and 64 are 900 gauss Gallium doped Yttrium Iron Garnet spheres 26 mils in diameter with coupling loops of about 40 mils in diameter.
- Transistor 66 is a Texas Instrument MS-175-YB normally drawing an emitter-to-base current of about 50 ma
- The output has an operable spectrum of about 2–4 gigahertz at from about 10 to about 50 milliwatts.

Figure 4:
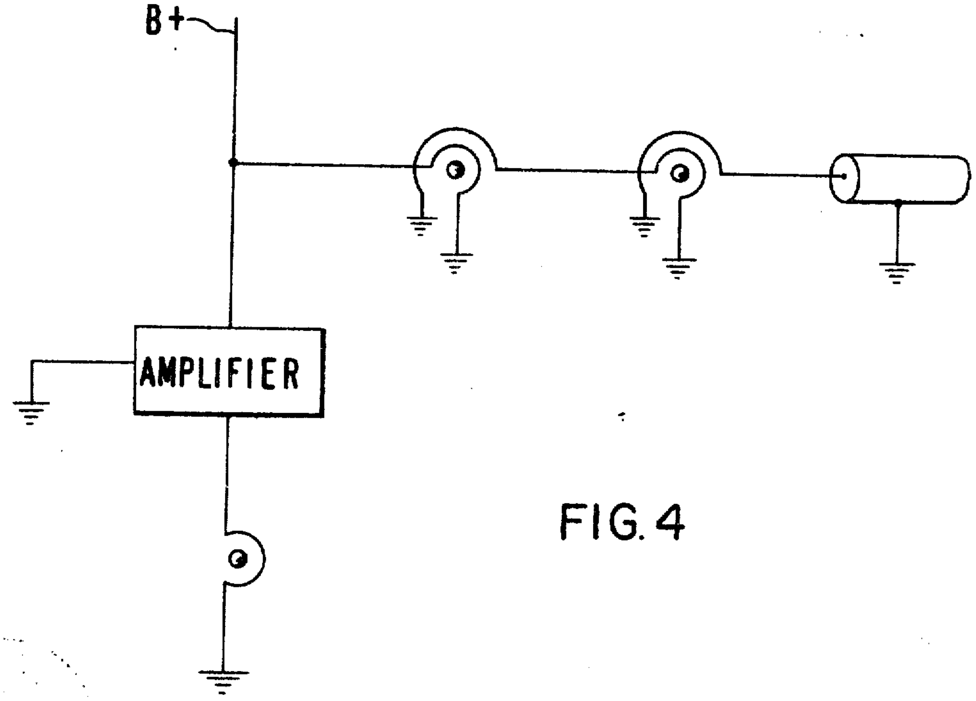
FIG. 4 is a schematic circuit of a YIG-tuned oscillator having a YIG resonator in the emitter circuit and a two-stage YIG bandpass filter in the output circuit.
Figure 5A:
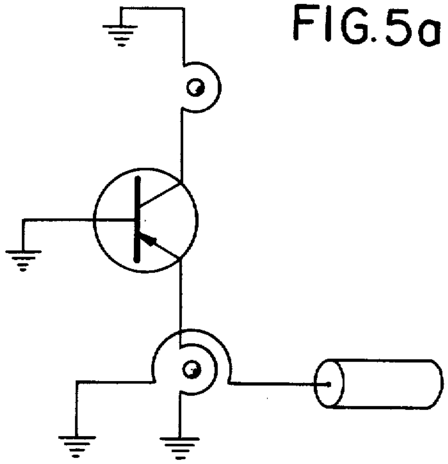
FIG. 5, parts *a–e*, are schematic circuits showing the YIG devices connected to the transistor in different relationships.
Figure 5B:
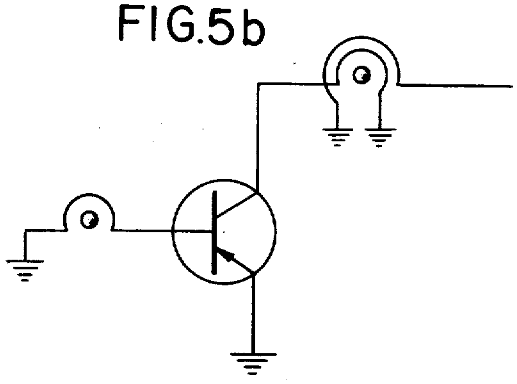
Figure 5C:
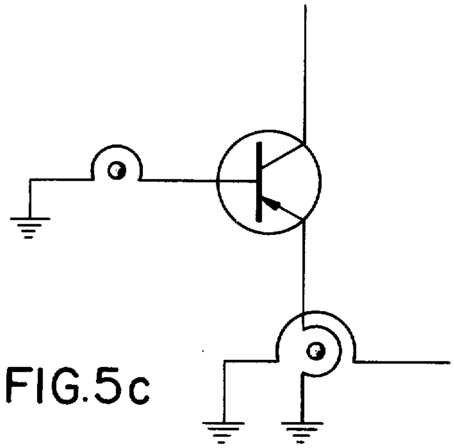
Figure 5D:
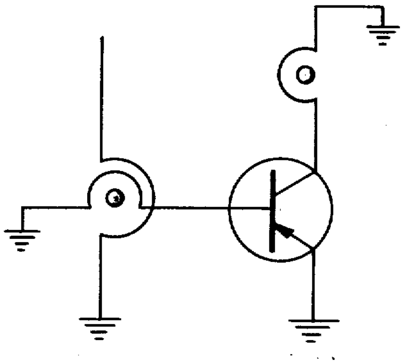
Figure 5E:
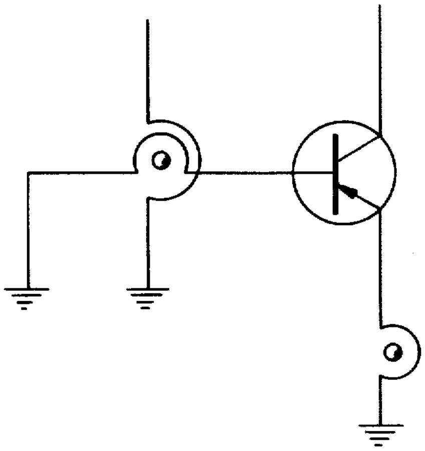

FIG. 4 shows a YIG-tuned oscillator with cascaded YIG transformer stages. The off-frequency rejection of cascaded YIG bandpass filters is about 6 db per octave per stage. Each added stage further reduces off-frequency noise and second harmonics. YIG bandpass filters are further described in an article entitled "Charting a Simpler Course to the Design of YIG Filters" by Walter Venator in *Electronics*, Mar. 3, 1969, Pages 119–126.

FIG. 5, parts *a–e*, shows the YIG devices 20 and 30 connected in different relationships to transistor 12. FIG. 5*a* shows the YIGs reversed from their FIG. 1 positions. Here resonator YIG 20 is in the collector circuit and transformer YIG 30 is in the emitter circuit. FIG. 5, parts *b* and *c*, show the resonator YIG in the base circuit and the transformer YIG alternatively in the collector and emitter circuits respectively. FIG. 5, parts *d* and *e*, show the transformer YIG in the base circuit and the resonator YIG alternatively in the collector and emitter circuits respectively.

Although the above description contains many specificities, these are not intended to limit the scope of the invention, but merely exemplify one preferred embodiment thereof. The true scope of the invention is intended to be indicated by the subject matter of the appended claims and their legal equivalents.

What is claimed is:

1. An oscillator circuit comprising:

means for providing at least one magnetic field of a predetermmined strength:

a ferrimagnetic resonator device positioned within said magnetic field, and exhibiting a gyromagnetic resonance frequency in response to the strength of said magnetic field;

an electronic amplifier means having a power input terminal for connection to an external power source, and having a signal input terminal separate from said power input terminal for connection to a signal source, said amplifier means being adapted to cause said signal input to control power from said source; means connected to signal input terminal for deriving an input signal from said ferrimagnetic device; and at least one frequency responsive ferrimagnetic output device positioned within the at least one magnetic field and in electrical communication with the amplifying means for passing the said gyromagnetic resonance frequency and for rejecting off frequencies.

2. The oscillator circuit of claim 1 wherein the means for providing at least one magnetic field provides a single magnetic field within which all of the ferrimagnetic devices are positioned.

3. The oscillator circuit of claim 2 wherein the single magnetic field is adjustable in strength throughout a predetermined range for establishing a spectrum of gyromagnetic resonance frequencies over which the ferrimagnetic devices tune in response to the magnetic field.

4. The oscillator circuit of claim 3 wherein the tuned ferrimagnetic devices are yttrium iron garnet spheres.

5. The oscillator circuit of claim 4 wherein the YIG spheres are single crystal and Gallium doped.

6. The oscillator circuit of claim 4 wherein the tuned YIG resonator is loop coupled to the amplifying means, and the at least one output YIG is a single YIG loop coupled, tuned bandpass filter having a center frequency at the gyromagnetic resonance frequency of the resonator YIG.

7. The oscillator circuit of claim 6 wherein the at least one output YIG comprises a plurality of loop coupled YIG bandpass filters all tuned to the gyromagnetic resonance frequency of the resonator YIG.

8. The oscillator circuit of claim 6 wherein the coupling loops of the at least one YIG tuned bandpass filter are positioned to determine the input impedance and output impedance of the filter.

9. The oscillator circuit of claim 8 wherein the input impedance of the YIG filter is matched to the output impedance of the amplifying means and the output impedance of the YIG filter is adjustable to maximize power output.

10. The oscillator of claim 4 wherein the amplifying means is a transistor and the YIG resonator is in the emitter circuit thereof and the YIG filter is in the collector circuit thereof.

* * * * *